United States Patent
Inada et al.

(10) Patent No.: US 8,017,444 B2
(45) Date of Patent: Sep. 13, 2011

(54) ADHESIVE SHEET, SEMICONDUCTOR DEVICE, AND PROCESS FOR PRODUCING SEMICONDUCTOR DEVICE

(75) Inventors: Teiichi Inada, Tsukuba (JP); Michio Mashino, Chiba (JP); Michio Uruno, Chiba (JP); Tetsuro Iwakura, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 501 days.

(21) Appl. No.: 11/578,939

(22) PCT Filed: Apr. 20, 2005

(86) PCT No.: PCT/JP2005/007529
§ 371 (c)(1),
(2), (4) Date: Oct. 19, 2006

(87) PCT Pub. No.: WO2005/103180
PCT Pub. Date: Nov. 3, 2005

(65) Prior Publication Data
US 2007/0241434 A1    Oct. 18, 2007

(30) Foreign Application Priority Data

Apr. 20, 2004 (JP) .............................. P2004-124118
Dec. 3, 2004 (JP) .............................. P2004-351605

(51) Int. Cl.
*H01L 21/00* (2006.01)
(52) U.S. Cl. ......... 438/118; 257/686; 257/783; 438/109
(58) Field of Classification Search .................. 428/343; 438/118, 119, 109; 257/686, 783
See application file for complete search history.

(56) References Cited

U.S. PATENT DOCUMENTS

| | | | | |
|---|---|---|---|---|
| 6,388,313 B1* | 5/2002 | Lee et al. | ...... | 257/686 |
| 6,930,396 B2* | 8/2005 | Kurita et al. | ...... | 257/777 |
| 7,070,670 B2* | 7/2006 | Tomiyama et al. | ...... | 156/248 |
| 2002/0096755 A1* | 7/2002 | Fukui et al. | ...... | 257/686 |

(Continued)

FOREIGN PATENT DOCUMENTS
JP    09-298369    11/1997
(Continued)

OTHER PUBLICATIONS
Machine translation of JP-10-183086 provided.*
(Continued)

*Primary Examiner* — Kiesha R Bryant
*Assistant Examiner* — Mark W Tornow
(74) *Attorney, Agent, or Firm* — Antonelli, Terry, Stout & Kraus, LLP.

(57) ABSTRACT

An object of the present invention is to provide an adhesive sheet that can fill irregularities due to wiring of a substrate or a wire attached to a semiconductor chip, etc., does not form resin burrs during dicing, and has satisfactory heat resistance and moisture resistance. The present invention relates to an adhesive sheet comprising 100 parts by weight of a resin comprising 15 to 40 wt % of a high molecular weight component containing a crosslinking functional group and having a weight-average molecular weight of 100,000 or greater and a Tg of −50° C. to 50° C., and 60 to 85 wt % of a thermosetting component containing an epoxy resin as a main component, and 40 to 180 parts by weight of a filler, the adhesive sheet having a thickness of 10 to 250 μm.

15 Claims, 4 Drawing Sheets

U.S. PATENT DOCUMENTS

| | | | |
|---|---|---|---|
| 2002/0180020 A1* | 12/2002 | Lin et al. .................. | 257/686 |
| 2002/0180025 A1* | 12/2002 | Miyata et al. ............. | 257/690 |
| 2003/0060022 A1* | 3/2003 | Peng et al. ................ | 438/460 |
| 2003/0159773 A1 | 8/2003 | Tomiyama et al. | |
| 2003/0176018 A1* | 9/2003 | Derderian ................. | 438/109 |
| 2004/0130020 A1* | 7/2004 | Kuwabara et al. ........ | 257/723 |
| 2005/0023674 A1* | 2/2005 | Kang et al. ............... | 257/723 |

FOREIGN PATENT DOCUMENTS

| | | |
|---|---|---|
| JP | 09-302313 | 11/1997 |
| JP | 10-183086 * | 7/1998 |
| JP | 10-338839 | 12/1998 |
| JP | 2001-220566 | 8/2001 |
| JP | 2001-279197 | 10/2001 |
| JP | 2001-279217 | 10/2001 |
| JP | 2001-308262 | 11/2001 |
| JP | 2002-146324 | 5/2002 |
| JP | 2002-222913 | 8/2002 |
| JP | 2002-265888 | 9/2002 |
| JP | 2002-359346 | 12/2002 |
| JP | 2003-147299 | 5/2003 |
| JP | 2003-206464 | 7/2003 |
| JP | 2003-301148 | 10/2003 |
| JP | 2004-043762 | 2/2004 |
| JP | 2004-072009 | 3/2004 |
| JP | 2004-083602 | 3/2004 |
| JP | 3913481 | 2/2007 |
| TW | 544902 | 8/2003 |
| WO | WO 01/60938 | 8/2001 |
| WO | WO01/74962 * | 10/2001 |

OTHER PUBLICATIONS

Yoshinobu Nakamura, Miho Yamaguchi, Masayoshi Okubo, Tsunetaka Matsumoto, Effect of particle size on impact properties of epoxy resin filled with angular shaped silica particles, Polymer, vol. 32, Issue 16, 1991, pp. 2976-2979, ISSN 0032-3861, DOI: 10.1016/0032-3861(91)90195-O.*

Haiying Wang, Yilong Bai, Sheng Liu, Jiali Wu, C. P. Wong, Combined effects of silica filler and its interface in epoxy resin, Acta Materialia, vol. 50, Issue 17, Oct. 9, 2002, pp. 4369-4377, ISSN 1359-6454, DOI: 10.1016/S1359-6454(02)00275-6.*

Korean Official Action dated Jul. 24, 2008, for Application No. 10-2006-7024117.

Korean Official Action issued May 29, 2009, for Application No. 10-2006-7024117.

Chinese Official Action issued Apr. 10, 2009, for Application No. 200580011773.9.

Japanese Official Action issued Nov. 10, 2009, for Application No. 2005-122447.

Taiwanese Official Action issued Jan. 21, 2011, for TW Application No. 10020053720.

Chinese Official Action issued Jan. 21, 2011, for CN Application No. 200910254219.3.

Japanese Official Action issued Oct. 26, 2010, for JP Application No. 2005-122447.

* cited by examiner

ADHESIVE SHEET, SEMICONDUCTOR DEVICE, AND PROCESS FOR PRODUCING SEMICONDUCTOR DEVICE

TECHNICAL FIELD

The present invention relates to an adhesive sheet, a semiconductor device, and a process for producing a semiconductor device.

BACKGROUND ART

In recent years, accompanying a reduction in the size of semiconductor packages, a CSP (Chip Size Package) having a similar size to that of a semiconductor chip and, furthermore, a stacked CSP in which semiconductor chips are stacked in multiple tiers have become widespread (ref. e.g. Japanese Patent Application Laid-open Nos. 2001-279197, 2002-222913, 2002-359346, 2001-308262, and 2004-72009). As examples thereof, there are a package shown in FIG. 1 in which a semiconductor chip A1 is stacked on a substrate 3 having irregularities due to wiring 4, etc., a package shown in FIG. 2 employing at least two semiconductor chips A1 of identical size in which another chip is further stacked over a semiconductor chip having irregularities due to a wire 2, etc. In such packages, an adhesive sheet in which the irregularities are embedded and that can ensure that there is insulation from the upper semiconductor chip is required. In FIG. 1 and FIG. 2, b1 is an adhesive.

In order to fill irregularities due to wiring, wires, etc. it is normally necessary to increase the thickness of the adhesive sheet to more than the height of the irregularities, and to reduce the melt viscosity of the adhesive sheet, thus improving the filling properties. However, an adhesive sheet having a large thickness and a low melt viscosity has the problems that the edges of a semiconductor chip obtained by dicing a wafer and the adhesive sheet are badly damaged and the amount of filamentous waste (resin burrs) increases.

That is, a dicing step normally involves laminating together a wafer, an adhesive sheet, and a dicing tape at 0° C. to 80° C., then simultaneously cutting them by means of a rotating blade, and carrying out washing, thus giving an adhesive-equipped semiconductor chip. In some cases, cutting waste from the adhesive sheet or the wafer becomes attached to a groove of the dicing tape formed after the above cutting process, and it becomes detached from the dicing tape during washing after cutting or when picking up the semiconductor chip, thus forming filamentous waste (resin burrs), which becomes attached to the semiconductor chip and thus contaminates an electrode, etc.

From the above-mentioned points, there is a desire for an adhesive sheet that has excellent dicing properties and excellent filling properties for irregularities due to wiring, wires, etc., and has satisfactory heat resistance and moisture resistance.

DISCLOSURE OF THE INVENTION

It is an object of the present invention to provide an adhesive sheet that can fill irregularities due to wiring of a substrate or a wire attached to a semiconductor chip, etc., does not form resin burrs during dicing, and has satisfactory heat resistance and moisture resistance.

The present inventors of the present invention have found that, in accordance with the use of an adhesive sheet having a specified resin composition, it is possible to prevent the occurrence of resin burrs during dicing, and fill irregularities due to wiring of a substrate or a wire attached to a semiconductor chip, etc. (embedding a projection within the adhesive sheet or filling a recess with an adhesive sheet), and the present invention has thus been accomplished.

That is, the present invention relates to an adhesive sheet comprising 100 parts by weight of a resin comprising 15 to 40 wt % of a high molecular weight component containing a crosslinking functional group and having a weight-average molecular weight of 100,000 or greater and a Tg of −50° C. to 50° C., and 60 to 85 wt % of a thermosetting component containing an epoxy resin as a main component, and 40 to 180 parts by weight of a filler, the adhesive sheet having a thickness of 10 to 250 μm.

Furthermore, the present invention relates to the adhesive sheet, wherein prior to curing the storage modulus by a dynamic viscoelasticity measurement at 25° C. is 200 to 3,000 MPa, and the storage modulus by a dynamic viscoelasticity measurement at 80° C. is 0.1 to 10 MPa.

Moreover, the present invention relates to the adhesive sheet, wherein the storage modulus by a dynamic viscoelasticity measurement at 170° C. subsequent to curing is 20 to 600 MPa.

Furthermore, the present invention relates to the adhesive sheet, wherein the melt viscosity at 100° C. prior to curing is 1,000 to 7,500 Pa·s. Moreover, the present invention relates to the adhesive sheet, wherein it comprises 100 parts by weight of the resin and 60 to 120 parts by weight of the filler.

Furthermore, the present invention relates to the adhesive sheet, wherein the filler has a Mohs' hardness of 3 to 8.

Moreover, the present invention relates to the adhesive sheet, wherein the filler has an average particle size of 0.05 to 5 μm and a specific surface area of 2 to 200 m$^2$/g.

Furthermore, the present invention relates to the adhesive sheet, wherein it is used in steps of laminating together a wafer, an adhesive sheet, and a dicing tape at 0° C. to 80° C., cutting the wafer, the adhesive sheet, and the dancing tape simultaneously by means of a rotating blade to give an adhesive-equipped semiconductor chip, and then bonding this adhesive-equipped semiconductor chip to a substrate or semiconductor chip having irregularities with a load of 0.001 to 1 MPa so as to fill the irregularities with adhesive.

Moreover, the present invention relates to a multi-layer adhesive sheet having a structure in which a first adhesive layer and a second adhesive layer are directly or indirectly layered, at least the second adhesive layer comprising the above adhesive sheet, and an amount of flow A μm and a thickness a μm of the first adhesive layer and an amount of flow B μm and a thickness b μm of the second adhesive layer satisfying the relationships A×3<B and a×2<b.

Furthermore, the present invention relates to a multi-layer adhesive sheet having a structure in which a first adhesive layer and a second adhesive layer are directly or indirectly layered, at least the second adhesive layer comprising the above adhesive sheet, and a melt viscosity a Pa·s and a thickness a μm of the first adhesive layer and a melt viscosity 0 Pa·s and a thickness b μm of the second adhesive layer satisfying the relationships a >β×3 and α×2<b.

Moreover, the present invention relates to the multi-layer adhesive sheet, wherein when a wafer, the adhesive sheet, and a dicing tape are laminated together, the first adhesive layer is on the side that is in contact with the wafer, and the second adhesive layer is on the side that is in contact with the dicing tape.

Furthermore, the present invention relates to a process for producing a semiconductor device, the process comprising steps of laminating a wafer, the adhesive sheet, and a dicing tape at 0° C. to 80° C., then cutting the wafer, the adhesive sheet, and the dancing tape simultaneously by means of a rotating blade to give an adhesive-equipped semiconductor chip, and then bonding this adhesive-equipped semiconductor chip to a substrate or a semiconductor chip having irregularities at a load of 0.001 to 1 MPa so as to fill the irregularities with adhesive.

Moreover, the present invention relates to the process for producing a semiconductor device, wherein when the adhesive-equipped semiconductor chip is bonded to the substrate or semiconductor chip having irregularities, the irregularities are heated.

Furthermore, the present invention relates to a semiconductor device formed by bonding a semiconductor chip and a substrate, or a semiconductor chip and a semiconductor chip using the adhesive sheet.

The disclosures of the present application relate to subject matter described in Japanese Patent Application No. 2004-124118 filed on Apr. 20, 2004 and Japanese Patent Application No. 2004-351605 filed on Dec. 3, 2004, and the contents of the disclosures therein are incorporated herein by reference.

BEST MODE FOR CARRYING OUT THE INVENTION

Figure 1:
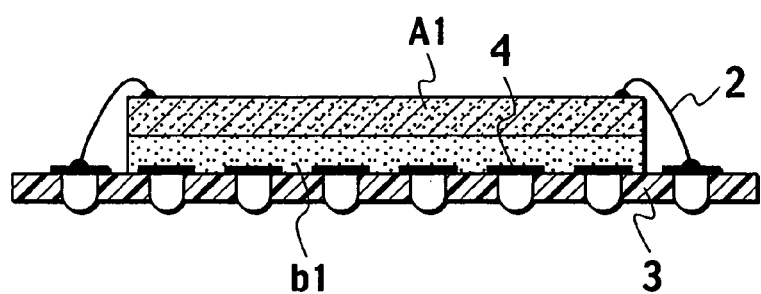
FIG. 1 is a sectional view showing one embodiment of a CSP.
Figure 2:
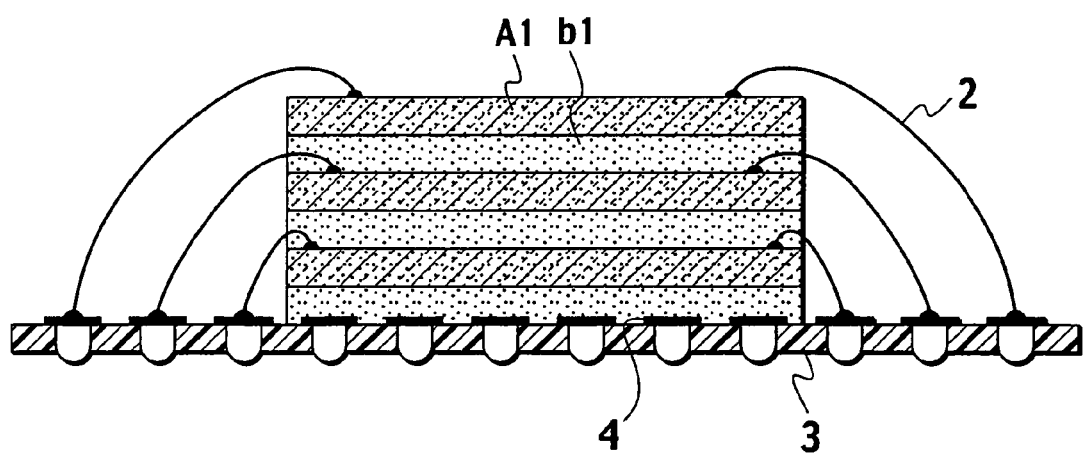
FIG. 2 is a sectional view showing one embodiment of a stacked CSP.

The adhesive sheet of the present invention comprises 100 parts by weight of a resin comprising 15 to 40 wt % of a high molecular weight component containing a crosslinking functional group and having a weight-average molecular weight of 100,000 or greater and a Tg of −50° C. to 50° C., and 60 to 85 wt % of a thermosetting component containing an epoxy resin as a main component, and 40 to 180 parts by weight of a filler, the adhesive sheet having a thickness of 10 to 250 μm.

With regard to the adhesive sheet of the present invention, components thereof are not particularly limited as long as it is an adhesive sheet comprising 100 parts by weight of a resin containing 15 to 40 wt % of a high molecular weight component containing a crosslinking functional group and having a weight-average molecular weight of 100,000 or greater and a Tg of −50 to 50° C., and 60 to 85 wt % of a thermosetting component having an epoxy resin as a main component, and 40 to 180 parts by weight of a filler, but in addition to the high molecular weight component, the thermosetting component, and the filler, the adhesive sheet may contain a curing accelerator, a catalyst, an additive, a coupling agent, etc. since an appropriate tack strength can be imparted and handling properties as a sheet can be improved.

Examples of the high molecular weight component include a polyimide resin, (meth)acrylic resin, urethane resin, polyphenylene ether resin, polyetherimide resin, phenoxy resin, and modified polyphenylene ether resin that have a crosslinking functional group such as an epoxy group, an alcoholic or phenolic hydroxyl group, or a carboxyl group, but it is not limited to these examples.

The above-mentioned adhesive sheet has good filling properties when the high molecular weight component is contained at 15 to 40 wt % of the resin, and the content of the high molecular weight component is preferably 20 to 37 wt %, and more preferably 25 to 35 wt %.

The high molecular weight component of the present invention is a high molecular weight component having a Tg (glass transition temperature) of −50° C. to 50° C., containing a crosslinking functional group, and having a weight-average molecular weight of 100,000 or greater.

As the high molecular weight component, for example, an epoxy group-containing (meth)acrylic copolymer obtained by polymerization of monomers that include a functional monomer such as glycidyl acrylate or glycidyl methacrylate and having a weight-average molecular weight of 100,000 or greater, etc. is preferable. Examples of the epoxy group-containing (meth)acrylic copolymer that can be used herein include a (meth)acrylic acid ester copolymer and an acrylic rubber, and the acrylic rubber is preferable.

The acrylic rubber is a rubber having an acrylic acid ester as a main component and mainly comprising a copolymer of butyl acrylate and acrylonitrile, etc. or a copolymer of ethyl acrylate and acrylonitrile, etc.

When the Tg of the high molecular weight component exceeds 50° C., the flexibility of the sheet might be degraded, and when the Tg is less than −50° C., since the flexibility of the sheet is too high, it becomes difficult to cut the sheet when dicing a wafer, and burrs might easily occur.

Furthermore, the weight-average molecular weight of the high molecular weight component is preferably at least 100,000 but no greater than 1,000,000; when the molecular weight is less than 100,000, the heat resistance of the sheet might be degraded, and when the molecular weight exceeds 1,000,000, the flow of the sheet might be degraded. The weight-average molecular weight is a polystyrene-basis value, and is determined by gel permeation chromatography (GPC) using a calibration curve obtained using a standard polystyrene.

It is preferable for the high molecular weight component to have a Tg of −20° C. to 40° C. and a weight-average molecular weight of 100,000 to 900,000 since the adhesive sheet is easily cut during wafer dicing, there is little generation of resin waste, and the heat resistance is high, and it is more preferable for the high molecular weight component to have a Tg of −10° C. to 400 and a molecular weight of 200,000 to 850,000.

With regard to the thermosetting component used in the present invention, an epoxy resin having the heat resistance and moisture resistance required when mounting a semiconductor chip is preferable. In the present invention, the 'thermosetting component containing an epoxy resin as a main component' includes an epoxy resin curing agent. The epoxy resin is not particularly limited as long as it exhibits an adhesive action upon curing. A dysfunctional epoxy resin such as a bisphenol A epoxy resin, a bisphenol F epoxy resin, or a bisphenol S epoxy resin, a novolac epoxy resin such as a phenol novolac epoxy resin or a cresol novolac epoxy resin, etc. may be used. Furthermore, a generally known epoxy resin such as a polyfunctional epoxy resin, a glycidyl amine type epoxy resin, a hetero ring-containing epoxy resin, or an alicyclic epoxy resin may be employed.

It is preferable for the epoxy resin to have a molecular weight of 1,000 or less, and more preferably 500 or less, in particular since the flexibility of a film in a B-stage state is high. It is also preferable to use in combination 50 to 90 parts by weight of a bisphenol A or bisphenol F epoxy resin having excellent flexibility and a molecular weight of 500 or less and 10 to 50 wt % of a polyfunctional epoxy resin having a molecular weight of 800 to 3,000, which has excellent heat resistance when cured.

With regard to the epoxy resin curing agent, a normally used known curing agent may be used, and examples thereof include amines, polyamide, acid anhydrides, polysulfide, boron trifluoride, bisphenols such as bisphenol A, bisphenol F, and bisphenol S, which have at least two phenolic hydroxyl groups per molecule, and phenolic resins such as a phenol novolac resin, a bisphenol A novolac resin, and a cresol novolac resin.

Furthermore, the adhesive sheet of the present invention comprises a filler in order to improve the dicing properties of the adhesive sheet in a B-stage state, improve the handling properties of the adhesive sheet, improve thermal conductivity, adjust melt viscosity, impart thixotropy, etc., and preferably comprises an inorganic filler.

Examples of the inorganic filler include aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, amorphous silica, and antimony oxide. In order to improve thermal conductivity, alumina, aluminum nitride, boron nitride, crystalline silica, amorphous silica, etc. are preferable. In order to adjust melt viscosity or impart thixotropy, aluminum hydroxide, magnesium hydroxide, calcium carbonate, magnesium carbonate, calcium silicate, magnesium silicate, calcium oxide, magnesium oxide, alumina, crystalline silica, amorphous silica, etc. are preferable. Furthermore, in order to improve dicing properties, alumina and silica are preferable.

In the present invention, it is preferable for the filler to be contained at 40 to 180 parts by weight relative to 100 parts by weight of the resin since the dicing properties are improved, the storage modulus after curing the adhesive sheet becomes 50 to 600 MPa at 170° C., and the wire bonding properties improve. The amount of filler is more preferably 60 to 160 parts by weight relative to 100 parts by weight of the resin, and yet more preferably 60 to 120 parts by weight.

It is preferable for the amount of filler added to be no greater than 180 parts by weight since when it becomes large, the problems of the storage modulus of the adhesive sheet increasing excessively, the adhesion deteriorating, the electrical properties being degraded due to remaining voids, etc. easily occur. When the amount of filler added is small, resin burrs tend to be easily formed during dicing.

The present inventors have found that in accordance with addition of the filler, the formation of resin burrs in the dicing step below can be greatly suppressed. That is, when dicing, a step in which a wafer, an adhesive sheet, and a dicing tape are simultaneously cut by means of a rotating blade and washed to give an adhesive-equipped semiconductor chip is normally employed. Cutting waste from the adhesive sheet or the wafer becomes attached to a groove in the dicing tape that is formed after cutting, and it becomes detached from the dicing tape in a filamentous state during cutting, washing after cutting, or pickup of the chip, thus forming resin burrs in some cases.

When the adhesive sheet of the present invention is used, particularly since it contains 40 to 180 parts by weight of silica, alumina filler, etc. relative to 100 parts by weight of the resin, the cutting waste from the resin or silicon formed during dicing is in the form of fine powder with the filler as a primary component, and it becomes easy to remove it together with washing water. Therefore, in accordance with use of the adhesive sheet of the present invention, the amount of cutting waste remaining on the dicing tape is small. Furthermore, since this small amount of cutting waste sticks to the dicing tape, it is resistant to becoming detached from the dicing tape in a filamentous state.

On the other hand, when it contains no filler, since cutting waste is in the form of a clay and is not removed together with washing water, a large amount of cutting waste becomes attached to the dicing tape. Since this cutting waste easily becomes detached from the dicing tape when washing or picking up the semiconductor chip, a lot of resin burrs are generated.

Furthermore, in the present invention, since the adhesive sheet contains the filler, no resin remains on the rotating blade when cutting the sheet, and the adhesive sheet can be cut well in a short period of time while polishing the rotating blade. It is therefore preferable, from the viewpoint of the effect of polishing the rotating blade and the ease of cutting the adhesive sheet, for the adhesive sheet to contain a hard filler, it is more preferable for it to contain a filler having a Mohs' hardness (scale of 10) of 3 to 8, and it is yet more preferable for it to contain a filler having a Mohs' hardness of 6 to 7. When the Mohs' hardness (scale of 10) of the filler is less than 3, the effect of polishing the rotating blade is small, whereas when the Mohs' hardness exceeds 8, the durability of the rotating blade for dicing tends to deteriorate. Examples of fillers having a Mohs' hardness of 3 to 8 include calcite, marble, gold (18K), iron, etc. (Mohs' hardness 3), fluorite, pearl, etc. (Mohs' hardness 4), apatite, glass, etc. (Mohs' hardness 5), orthoclase, opal, etc. (Mohs' hardness 6), and silica, quartz, tourmaline, etc. (Mohs' hardness 7), and among them silica, which has a Mohs' hardness of 7, is preferable since it is inexpensive and readily available.

If the average particle size of the filler is less than 0.05 µm, it tends to become difficult to impart flowability to the adhesive sheet while imparting to the filler the effect of polishing the rotating blade, whereas if the average particle size exceeds 5 µm, it becomes difficult to reduce the thickness of the adhesive sheet, and it tends to become difficult to maintain smoothness on the surface of the adhesive sheet. It is therefore preferable, from the viewpoint of the flowability and the surface smoothness of the adhesive sheet, for the average particle size of the filler to be 0.05 to 5 µm. Furthermore, from the viewpoint of excellent flowability, the average particle size preferably has a lower limit of 0.1 µm, and particularly preferably 0.3 µm. Moreover, from the viewpoint of smoothness, the average particle size preferably has an upper limit of 3 µm, and particularly preferably 1 µm.

In the present invention, the average particle size of the filler is measured using a laser diffraction particle size distribution analyzer (Microtrac, manufactured by Nikkiso Co., Ltd.). Specifically, 0.1 to 1.0 g of the filler is weighed, dispersed by means of ultrasound, and then subjected to measurement of particle size distribution, and a particle size that gives a 50% cumulative weight in the distribution is defined as the average particle size.

With regard to the specific surface area of the filler, in the same manner as for the average particle size of the filler, from the viewpoint of the flowability and the surface smoothness, it is preferably 2 to 200 m²/μg, and from the viewpoint of the flowability the upper limit of the specific surface area is more preferably 50 m²/g, and particularly preferably 10 m²/g.

In the present invention, the specific surface area (BET specific surface area) is a value obtained from the Brunauer-Emmett-Teller equation by measuring surface area as a result of making nitrogen adsorb on an inorganic filler, and can be measured by a commercial BET system.

The adhesive sheet of the present invention may be obtained by mixing and kneading the above-mentioned high molecular weight component, thermosetting component with an epoxy resin as a main component, filler, and other components in an organic solvent to give a varnish, then forming a layer of the above-mentioned varnish on a substrate film, drying by heating, and then removing the substrate. The above-mentioned mixing and kneading may be carried out by employing in combination as appropriate dispersers such as a normal stirrer, a mortar and pestle machine, a three-roll mill, and a ball mill. The above-mentioned drying by heating is not particularly limited as long as it is carried out under conditions in which the solvent used vaporizes sufficiently, but it is normally carried out by heating at 60° C. to 200° C. for 0.1 to 90 minutes.

The organic solvent used for preparation of the varnish in production of the adhesive sheet, that is, a residual volatile component after preparation of the adhesive sheet, is not limited as long as materials can be dissolved, kneaded, or dispersed uniformly, and a conventionally known solvent may be used. Examples of such a solvent include dimethylformamide, dimethylacetamide, N-methylpyrrolidone, ketone solvents such as acetone, methyl ethyl ketone, and cyclohexanone, toluene, and xylene. It is preferable to use methyl ethyl ketone, cyclohexanone, etc., since the drying speed is high and the cost is low.

The amount of organic solvent used is not particularly limited as long as the residual volatile content in the prepared adhesive sheet is 0.01 to 3 wt % relative to the total weight, but it is preferable from the viewpoint of heat resistance reliability for it to be 0.01 to 2 wt % relative to the total weight, and more preferably 0.01 to 1.5 wt % relative to the total weight.

The thickness of the adhesive sheet is 10 to 250 μm in order that irregularities due to gold wire attached to a wiring circuit of a substrate or a lower layer semiconductor chip can be filled. If it is thinner than 10 μm, the effect of relieving stress and the adhesion tend to become poor, and if it is thicker than 250 μm, not only is it uneconomic, but also a requirement for a small size semiconductor device cannot be met. It is preferable for it to be 20 to 100 μm, and more preferably 40 to 80 μm, from the viewpoint of high adhesion and a thin semiconductor device.

In the present invention, it is preferable if the storage modulus by dynamic viscoelasticity measurement at 25° C. of the adhesive sheet prior to curing (in a B-stage state) is 200 to 3,000 MPa since the dicing properties are excellent. It is more preferable for it to be 500 to 2,000 MPa from the viewpoint of excellent dicing properties and excellent adhesion to a wafer. If the storage modulus by dynamic viscoelasticity measurement at 80° C. of the adhesive sheet prior to curing (in a B-stage state) is 0.1 to 10 MPa, laminating to a wafer at 80° C. is possible. It is particularly preferable for it to be 0.5 to 5 MPa from the viewpoint of high adhesion to a wafer.

In the present invention, it is preferable for the storage modulus by dynamic viscoelasticity measurement at 170° C. of the adhesive sheet subsequent to curing (in a C-stage state) is 20 to 600 MPa in order to obtain good wire bonding properties. The storage modulus is more preferably 40 to 600 MPa, and yet more preferably 40 to 400 MPa.

Modulus of elasticity may be measured using a dynamic viscoelastometer (DVE-V4, manufactured by Rheology Co., Ltd.) (sample size: length 20 mm, width 4 mm, temperature range −30° C. to 200° C., rate of temperature increase 5° C./min, tensile mode, 10 Hz, automatic static load).

The adhesive sheet of the present invention may be used as a multi-layer adhesive sheet having a multi-layer structure such as, for example, a laminate of two or more of the above-mentioned adhesive sheets or a laminate of a plurality of sheets including the adhesive sheet of the present invention and another adhesive sheet.

For example, it may be used as a multi-layer adhesive sheet having a structure in which a first adhesive layer and a second adhesive layer are directly or indirectly layered, at least the second adhesive layer comprising the adhesive sheet of the present invention, the amount of flow A and the thickness a μm of the first adhesive layer and the amount of flow B and the thickness b μm of the second adhesive layer having the relationships $A \times 3 < B$ and $a \times 2 < b$. With regard to the multi-layer adhesive sheet, it is preferable that when a wafer, the adhesive sheet, and a dicing tape are laminated together the side that is in contact with the wafer is the first adhesive layer, and the side that is in contact with the dicing tape is the second adhesive layer.

By employing such a two layer sheet, it is possible to carry out bonding by appropriately selecting a pressure, temperature, and time (pressure in particular) for the bonding according to the absolute value of A or B so that irregularities are embedded in the second layer and the irregularities do not pierce the first layer. That is, it is possible to ensure the filling properties for wiring or wire and the insulation between the wiring or wire and an upper semiconductor chip. When $A \times 3 \geq B$, the effect of the first adhesive layer in preventing the wiring or wire from penetrating is small, and there is a tendency for a circuit that forms irregularities on a substrate or the wire to make contact with the above positioned semiconductor chip, thus preventing the insulation from being guaranteed, and when $a \times 2 \geq b$, there is a tendency for the filling properties for irregularities or wire to be degraded, thus easily causing voids.

In the present invention, the amount of flow may be obtained by pressing a sample, formed by stamping an adhesive sheet prior to curing and a PET film into 1×2 cm strips, using a thermocompression bonding tester (manufactured by Tester Sangyo Co., Ltd.) at a hot plate temperature of 100° C. and a pressure of 1 MPa for 18 seconds, and then measuring the length of resin protruding from the edge of the sample using an optical microscope.

Furthermore, it is possible, for example, to employ a multi-layer adhesive sheet having a structure in which a first adhesive layer and a second adhesive layer are directly or indirectly layered, at least the second adhesive layer comprising the adhesive sheet of the present invention, and the melt viscosity α Pa·s and the thickness a μm of the first adhesive layer and the melt viscosity β Pa·s and the thickness b μm of the second adhesive layer having the relationships $a > \beta \times 3$ and $a \times 2 < b$. With regard to the multi-layer adhesive sheet, it is preferable that when a wafer, the adhesive sheet, and a dicing tape are laminated together the side that is in contact with the wafer is the first adhesive layer, and the side that is in contact with the dicing tape is the second adhesive layer.

By employing such a two layer sheet, it is possible to carry out bonding by appropriately selecting a pressure, temperature, and time (pressure in particular) for the bonding according to the absolute value of α or β so that irregularities are embedded in the second layer and the irregularities do not pierce the first layer. That is, it is possible to ensure the filling properties for wiring or wire and the insulation between the wiring or wire and an upper semiconductor chip. When $\alpha \leq \beta \times 3$, the effect of the first adhesive layer in preventing the wiring or wire from penetrating is small, and there is a tendency for it to make contact with a circuit that forms irregularities on a substrate or with the semiconductor chip positioned above the wire, thus preventing the insulation from being guaranteed, and when $a \times 2 \geq b$, there is a tendency for the filling properties for irregularities or wire to be degraded, thus easily causing voids.

In the present invention, the melt viscosity may be obtained using a parallel plate plastometer method, which will be described later, by measuring and calculating for an adhesive sheet prior to curing.

It is preferable for A, B, $\alpha$, $\beta$, a, and b to be in their respective appropriate ranges; A is preferably 100 to 400 μm, and B is preferably 300 to 2,000 μm. When they are too low, the filling properties are degraded, and when they are too high, the resin tends to protrude from the edge of the semiconductor chip to a great extent. $\alpha$ is preferably 3,000 to 1,500,000 Pa·s. $\beta$ is preferably 1,000 to 7,500 Pa·s, particularly preferably 1,000 to 5,000 Pa·s, and more preferably 1,500 to 3,000 Pa·s. When they are too high, the filling properties are degraded, and when they are too low, the resin tends to protrude from the edge of the semiconductor chip to a great extent. Furthermore, a is preferably 5 to 30 μm, and b is preferably 10 to 250 μm. When the adhesive sheet is used as a single layer, it is preferable that the flow, the melt viscosity, and the thickness of the adhesive sheet on its own are in the above-mentioned ranges specified for B, $\beta$, and b.

The first adhesive layer is not particularly limited as long as it can be bonded to a wafer at 80° C. or below, and HIATTACH HS-210 and HS-230 manufactured by Hitachi Chemical Co., Ltd., etc. may be used. As the second adhesive layer, the adhesive sheet of the present invention may be used.

As a preferred example of a combination, HIATTACH HS-230 (amount of flow 250 μm, thickness 10 μm, melt viscosity 320,000 Pa·s) and the adhesive sheet of the present invention (amount of flow 1,000 μm, thickness 70 μm, melt viscosity 2,200 Pa·s) can be cited. In this case, the relationships $A \times 3^1 < B$, $\alpha > \beta \times 3$, and $a \times 2 < b$ are satisfied.

The adhesive sheet of the present invention may be used on its own, and as one embodiment it may be used as an integrated dicing tape-type adhesive sheet in which the adhesive sheet of the present invention is layered on a conventionally known dicing tape. In this case, only one lamination step onto a wafer is required, and the operation can be carried out efficiently.

Examples of the dicing tape used in the present invention include plastic films such as polytetrafluoroethylene film, polyethylene terephthalate film, polyethylene film, polypropylene film, polymethylpentene film, and polyimide film. A surface treatment such as a primer coating, a UV treatment, a corona discharge treatment, a polishing treatment, or an etching treatment may be carried out as necessary. The dicing tape preferably has tackiness; the above-mentioned plastic film to which tackiness has been imparted may be used, or a tacky layer may be provided on one side of the above-mentioned plastic film. This can be formed by coating the film with a resin composition having an appropriate tack strength, which is obtained by adjusting the ratio of liquid components and the Tg of a high molecular weight component in particular, and drying the coating.

Furthermore, when the adhesive sheet is used for production of a semiconductor device, it is desirable for it to have a tack strength such that the semiconductor chips are not scattered during dicing and are released from the dicing tape during subsequent pickup. For example, if the tackiness of the adhesive sheet is too high, pickup might become difficult. It is therefore preferable to adjust the tack strength of the adhesive sheet as appropriate, and as a method therefore the tendency for the adhesive strength and the tack strength to be increased as a result of increasing the flow of the adhesive sheet at room temperature, and the tendency for the adhesive strength and the tack strength to be decreased as a result of decreasing the flow may be utilized. For example, in order to increase the flow, there are methods in which the content of a plasticizer is increased, the content of a tackifying material is increased, etc. In contrast thereto, in order to decrease the flow, the contents of the above-mentioned compounds may be decreased. Examples of the plasticizer include a monofunctional acrylic monomer, a monofunctional epoxy resin, a liquid epoxy resin, an acrylic resin, and a so-called epoxy-based diluent.

As a method of layering an adhesive sheet on a dicing tape, in addition to printing, a method in which a preformed adhesive sheet is laminated on a dicing tape by means of pressing or a hot roll can be cited, and the method involving hot roll lamination is preferable since production can be carried out continuously and the efficiency is good.

The thickness of the dicing tape is not particularly limited; it is appropriately determined based on the knowledge of a person skilled in the art according to the film thickness of the adhesive sheet or the intended application of an integrated dicing tape-type adhesive sheet, and is 60 to 150 μm, and preferably 70 to 130 μm, since it is economical and the handling properties of the film are good.

The adhesive sheet of the present invention is preferably used in production of a semiconductor device, and more preferably in semiconductor device production comprising steps of laminating together a wafer, an adhesive sheet, and a dicing tape at 0° C. to 80° C., then cutting the wafer, the adhesive sheet, and the dicing tape simultaneously by means of a rotating blade to give an adhesive-equipped semiconductor chip, and then bonding this adhesive-equipped semiconductor chip to a substrate or a semiconductor chip having irregularities at a load of 0.001 to 1 MPa so as to fill the irregularities with adhesive.

In the present invention, as the wafer, in addition to monocrystalline silicon, polycrystalline silicon, various types of ceramic, or a compound semiconductor such as gallium arsenide, etc. may be used.

When the adhesive sheet is used as a single layer, after the adhesive sheet is laminated to the wafer, the dicing tape may be laminated to the adhesive sheet side. When the adhesive sheet is used in multiple layers, a first adhesive layer and a second adhesive layer may be laminated to the wafer in sequence, or a multi-layer adhesive sheet may be formed in advance from the first adhesive layer and the second adhesive layer, and this multi-layer adhesive sheet may be then laminated to the wafer. In accordance with the use of an integrated dicing tape-type adhesive sheet comprising the adhesive sheet or the multi-layer adhesive sheet of the present invention, and the dicing tape, a semiconductor device may also be produced.

A temperature at which the adhesive sheet is affixed to the wafer, that is, a lamination temperature, is 0° C. to 80° C., preferably 15° C. to 80° C., and more preferably 20° C. to 70° C. When it exceeds 80° C., distortion of the wafer after laminating the adhesive sheet tends to become large.

When the dicing tape or the integrated dicing tape-type adhesive sheet is laminated, it is preferable for it to be carried out at the above-mentioned temperature.

Figure 3:
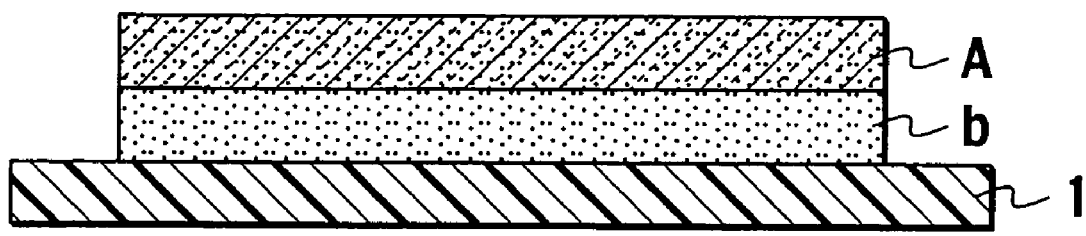
FIG. 3 is a sectional view showing one embodiment of an adhesive sheet, a semiconductor wafer, and a dancing tape of the present invention.
Figure 4:
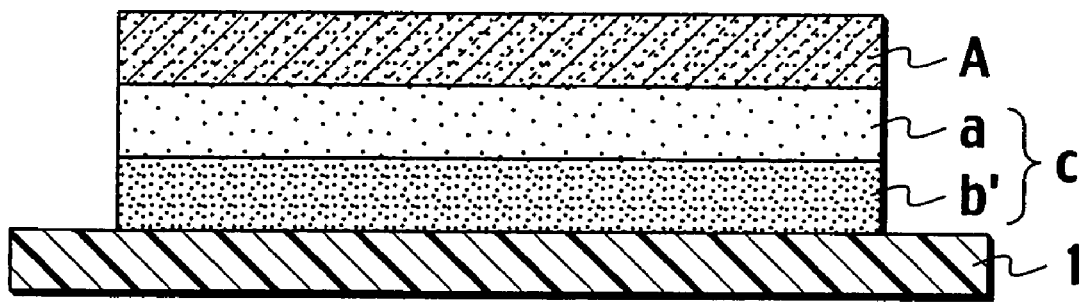
FIG. 4 is a sectional view showing one embodiment of a multi-layer adhesive sheet, a semiconductor wafer, and a dicing tape of the present invention.

FIG. 3 shows a sectional view of an adhesive sheet b, a semiconductor wafer A, and a dancing tape 1 of one embodiment of the present invention, and FIG. 4 shows a sectional view of a multi-layer adhesive sheet c, the semiconductor wafer A, and the dicing tape 1 of one embodiment of the present invention. In FIG. 4, a denotes a first adhesive layer, and b' denotes a second adhesive layer.

Subsequently, the semiconductor wafer to which are laminated the adhesive sheet and the dicing tape is diced using a dicing cutter, then washed, and dried, thus giving an adhesive-equipped semiconductor chip.

Figure 6:
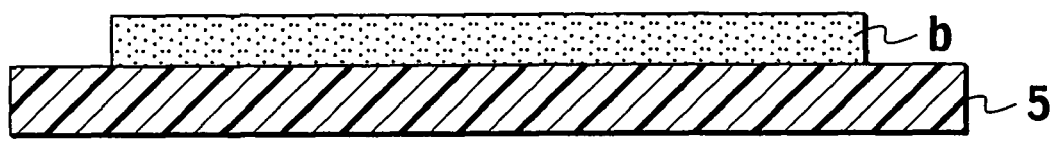
FIG. 6 is a sectional view showing one embodiment of a substrate film-equipped adhesive sheet of the present invention.

As another embodiment, the adhesive sheet of the present invention may be used as a substrate film-equipped adhesive sheet in which an adhesive sheet b is provided on a substrate film 5 as shown in FIG. 6. By so doing, it is convenient even when the adhesive sheet is difficult to handle on its own; for example, by laminating the adhesive sheet of the structure in FIG. 6 to the above-mentioned dicing tape, then peeling off the substrate film 5, and subsequently laminating to the semiconductor wafer A, the structure shown in FIG. 3 can easily be achieved. It is also possible to use the substrate film 5 as a cover film without peeling it off.

The above-mentioned substrate film 5 is not particularly limited, and examples thereof include polyester film, polypropylene film, polyethylene terephthalate film, polyimide film, polyetherimide film, polyether naphthalate film, and methylpentene film.

Figure 7:
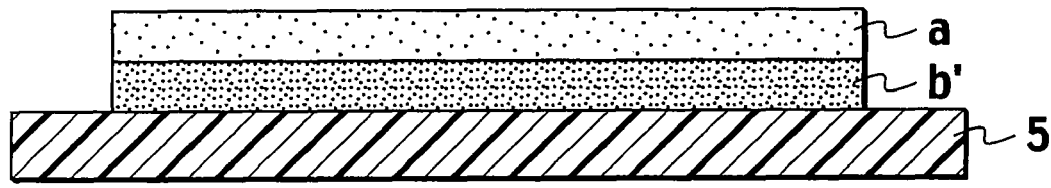
FIG. 7 is a sectional view showing one embodiment of a substrate film-equipped multi-layer adhesive sheet of the present invention.

Furthermore, the adhesive sheet of the present invention may be used as a substrate film-equipped adhesive sheet in which multiple layers of adhesive sheets are provided on a substrate film in the order: second adhesive layer b', first adhesive layer a, as shown in FIG. 7. They may also be layered on the substrate film in the order: first adhesive layer a, second adhesive layer b'.

Figure 8:
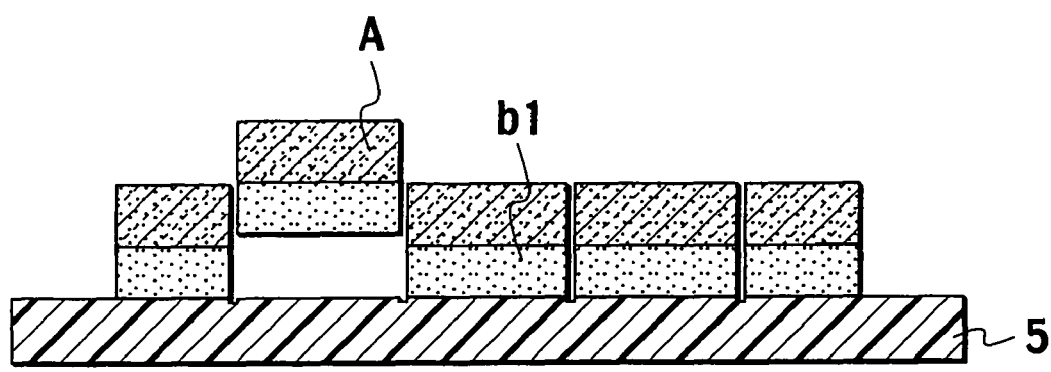
FIG. 8 is a sectional view showing one embodiment of an adhesive-equipped semiconductor chip of the present invention.

As another embodiment, the adhesive sheet of the present invention may have a structure shown in FIG. 6 and FIG. 7 and the adhesive sheet itself may function as a dicing tape. Such an adhesive sheet is called an integrated dicing/die-bonding type adhesive sheet, etc., and since the single sheet functions both as a dicing tape and as an adhesive sheet, an adhesive-equipped semiconductor chip can be obtained as shown in FIG. 8 by just dicing and pickup.

In order to impart such functions to the adhesive sheet, for example, the adhesive sheet may contain a photocuring component such as a photocuring high molecular weight component, a photocuring monomer, or a photoinitiator. Such an integrated-type sheet has been subjected to irradiation with light when the semiconductor chip is bonded to the substrate or the semiconductor chip, and a value for the storage modulus by a dynamic viscoelasticity measurement at 25° C. prior to curing and a value for the storage modulus by a dynamic viscoelasticity measurement at 80° C. prior to curing denote values in a stage that is after irradiation with light and before thermosetting.

The integrated dicing/die bonding-type adhesive sheet is preferably used in production of a semiconductor device comprising steps of laminating together a wafer, an adhesive sheet, and a dicing tape at 0° C. to 80° C., then cutting the wafer, the adhesive sheet, and the dicing tape simultaneously by means of a rotating blade to give an adhesive-equipped semiconductor chip, and then bonding this adhesive-equipped semiconductor chip to a substrate or a semiconductor chip having irregularities at a load of 0.001 to 1 MPa so as to fill the irregularities with adhesive.

Figure 5:
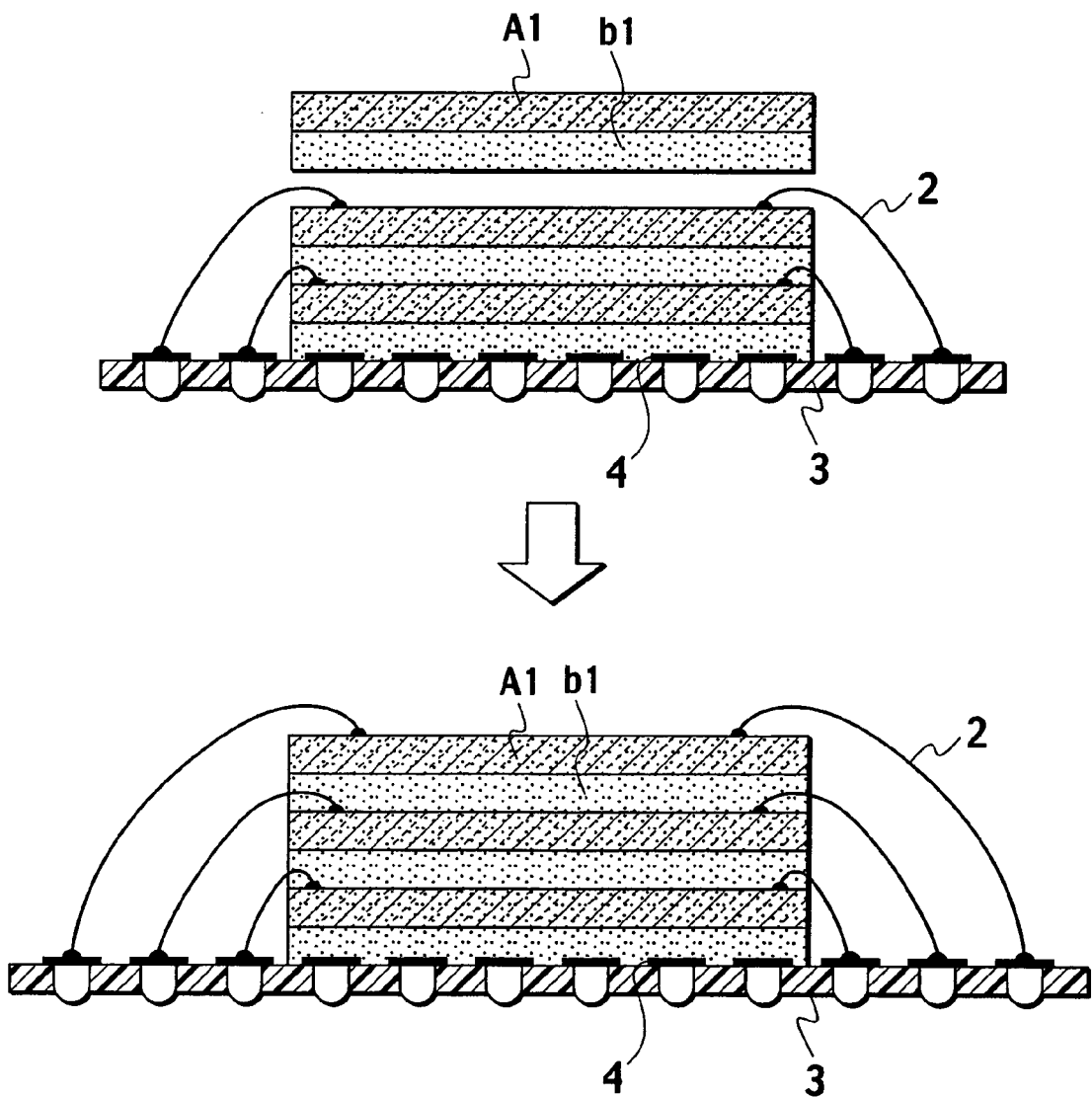
FIG. 5 is a schematic diagram showing one embodiment of a step when bonding an adhesive-equipped semiconductor chip employing an adhesive sheet of the present invention to a wire-bonded chip.

The adhesive-equipped semiconductor chip A1 thus obtained is bonded to a substrate 3 having irregularities due to wiring 4 or a semiconductor chip having irregularities due to a wire 2 via an adhesive b1 at a load of 0.001 to 1 MPa, and the irregularities are filled by the adhesive (FIG. 5). The load is preferably 0.01 to 0.5 MPa, and more preferably 0.01 to 0.3 MPa. When the load is less than 0.001 MPa, there is a tendency for voids to occur and the heat resistance to be degraded, and when it exceeds 1 MPa, there is a tendency for the semiconductor chip to break.

FIG. 5 is a schematic drawing showing one example of a step of bonding an adhesive-equipped semiconductor chip to a wire-bonded semiconductor chip.

In the present invention, when the adhesive-equipped semiconductor chip is bonded to a substrate or a semiconductor chip, it is preferable to heat irregularities due to wiring of the substrate, wires of the semiconductor chip, etc. The heating temperature is preferably 60° C. to 240° C., and more preferably 100° C. to 180° C. When it is less than 60° C., the bonding properties tend to deteriorate, and when it exceeds 240° C., there is a tendency for the substrate to deform, and distortion to increase. Examples of the heating method include a method in which the substrate or the semiconductor chip is put into contact with a preheated hot plate, a method in which the substrate or the semiconductor chip is irradiated with infrared rays or microwaves, and a method in which it is exposed to hot air.

In the present invention, in accordance with use of an adhesive sheet having a specified resin composition, it is possible to prevent cutting waste formed when cutting the adhesive sheet or the wafer by means of a rotating blade during dicing from becoming detached in a filamentous state from the dicing tape during washing or pickup after cutting. Furthermore, an adhesive sheet having a multi-layer structure, particularly one in which a layer having low flow and a layer having high flow are layered or one in which a layer having a high melt viscosity and a layer having a low melt viscosity are layered, has excellent filling properties for a wiring circuit and wire and excellent insulation from upper and lower semiconductor chips.

Furthermore, since the adhesive sheet of the present invention has good filling properties for a wiring circuit and wire and excellent cutting properties during a dicing step in production of a semiconductor device in which the wafer and the adhesive sheet are simultaneously cut, the speed of dicing can be increased. Because of this, in accordance with the adhesive sheet of the present invention, it is possible to improve the yield of the semiconductor device and enhance the production speed.

Moreover, the adhesive sheet of the present invention may be used as an adhesive sheet having excellent adhesion reliability in a step of bonding a semiconductor chip to a supporting member such as a substrate or a lower layer chip in production of a semiconductor device. That is, the adhesive sheet of the present invention has the heat resistance, moisture resistance, and insulation that are required when mounting a semiconductor chip on a supporting member for mounting a semiconductor, and has excellent workability.

EXAMPLES

Composition of Adhesive Sheet and Production Process

Example 1

A composition containing 30 parts by weight of a bisphenol F epoxy resin (epoxy equivalent 160, product name YD-8170C, manufactured by Tohto Kasei Co., Ltd.) and 10 parts by weight of a cresol novolac epoxy resin (epoxy equivalent 210, product name YDCN-703, manufactured by Tohto Kasei Co., Ltd.) as epoxy resins; 27 parts by weight of a phenol novolac resin (product name Plyophen LF2882, manufactured by Dainippon Ink and Chemicals, Incorporated) as a curing agent for the epoxy resin; 28 parts by weight of an epoxy group-containing acrylic rubber (weight-average molecular weight by gel permeation chromatography 800,000, 3 wt % of glycidyl methacrylate, Tg −7° C., product name HTR-860P-3DR manufactured by Nagase chemteX Corporation) as an epoxy group-containing acrylic copolymer; 0.1 parts by weight of an imidazole-based curing accelerator (Curezol 2PZ-CN manufactured by Shikoku Chemicals Corporation) as a curing accelerator; 95 parts by weight of a silica filler (manufactured by Admafine Corp., S0-C2 (specific gravity: 2.2 g/cm$^3$, Mohs' hardness 7, average particle size 0.5 µm, specific surface area 6.0 m$^2$/g)); and 0.25 parts by weight (product name A-189, manufactured by Nippon Unicar Co., Limited) and 0.5 parts by weight (product name A-1160, manufactured by Nippon Unicar Co., Limited) as silane coupling agents was added to and mixed with cyclohexanone while stirring, and degassing in vacuum was carried out to give an adhesive varnish.

This adhesive varnish was applied on a 50 µm thick release-treated polyethylene terephthalate film, drying was carried out by heating at 90° C. for 10 minutes and at 120° C. for 5 minutes to give a coating with a film thickness of 75 µm, and an adhesive sheet in a B-stage state was thus prepared. The flow of this film was 757 µm.

The adhesive sheet b was laminated at 60° C. to a semiconductor wafer A (thickness 80 µm) that was to be processed, and the edges were cut off. This was laminated with a dicing tape 1 by means of a hot roll laminator (Riston, manufactured by Du Pont) at 25° C. (FIG. 3). The dicing tape was UC3004M-80 manufactured by The Furukawa Electric Co., Ltd. The film thickness of the dicing tape was 100 µm.

Example 2

HS-230 (thickness 10 µm) as a first adhesive layer and the same adhesive sheet as in Example 1 as a second adhesive layer were laminated at 60° C. to give a multi-layer adhesive sheet having first and second adhesive layers. When the amount of flow was measured in a state in which the first adhesive layer and the second adhesive layer were laminated together, the first adhesive layer was 200 µm, and the second adhesive layer was 758 µm.

The multi-layer adhesive sheet was laminated at 60° C. to a semiconductor wafer A (thickness 80 µm) that was to be processed so that the second adhesive layer was in contact with the semiconductor wafer A, and the edges were cut off. The dicing tape 1 was placed on this so that the second adhesive layer b was layered on the dicing tape 1, and they were laminated at 25° C. by means of a hot roll laminator (Riston, manufactured by Du Pont) (FIG. 4). The dicing tape was UC3004M-80 manufactured by The Furukawa Electric Co., Ltd. The film thickness of the dicing tape was 100 µm.

Example 3

An adhesive sheet was prepared in the same manner as in Example 1 except that the film thickness was 50 µm.

Comparative Example 1

A sample was prepared in the same manner as in Example 1 except that the filler was not used. The flow of the adhesive sheet was 2,000 µm.

Examples 4 to 8 and Comparative Examples 2 and 3

Adhesive sheets were prepared in the same manner as in Example 1 except that the contents of the filler and the epoxy group-containing acrylic rubber were changed to the amounts shown in Table 1.

Evaluation (1) Modulus of Elasticity Subsequent to Curing

The modulus of elasticity at 170° C. of an adhesive sheet in a C-stage state was measured using a dynamic viscoelastometer (DVE-V4, manufactured by Rheology Co., Ltd.) (sample size: length 20 mm, width 4 mm, temperature range −30° C. to 200° C., rate of temperature increase 5° C./min, tensile mode, 10 Hz, automatic static load).

(2) Bonding Strength

A semiconductor chip (5 mm square) was bonded onto a gold-plated substrate (copper foil-equipped flexible substrate electrolytic gold plated (N1: 5 µm, Au: 0.3 µm)) using an adhesive sheet on a hot plate at 120° C., and cured at 130° C. for 30 minutes +170° C. for 1 hour. This sample was subjected to a measurement of shear strength at 260° C. after moisture absorption at 85° C./85% RH for 48 hours.

(3) Lamination Properties

An adhesive sheet with a width of 10 mm and a wafer were laminated together by means of a hot roll laminator (60° C., 0.3 m/minutes, 0.3 MPa), and subsequently a 90° peel strength was determined in which the adhesive sheet was peeled off at an angle of 90° at a tensile speed of 50 mm/minute using a UTM-4-100 tensilon manufactured by TOYOBALWIN in an atmosphere at 25° C. When the 90° peel strength was 30 N/m or greater, the lamination properties were good (0), and when the 90° peel strength was less than 30 N/m, the lamination properties were poor (X).

(4) Flow

The amount of flow was defined as a value obtained by pressing a sample, formed by stamping an adhesive sheet and a PET film into 1×2 cm strips, using a thermocompression bonding tester (manufactured by Tester Sangyo Co., Ltd.) at a hot plate temperature of 100° C. and a pressure of 1 MPa for 18 seconds, and then measuring the length of resin protruding from the edge of the sample using an optical microscope.

(5) Dicing Properties

The adhesive sheet and dicing tape-equipped semiconductor wafer was diced using a dicing cutter, then washed, and dried to give an adhesive sheet-equipped semiconductor chip. The maximum height of cracks on the side of the semiconductor chip and the length of resin burrs were measured, and an evaluation of "0" was given when they were 30 µm or less and "X" when they exceeded 30 µm.

(6) Filling Properties, Reflow Crack Resistance, Temperature Cycle Resistance

A semiconductor device sample was prepared by bonding an adhesive-equipped semiconductor chip and a wiring substrate that employed a 25 µm thick polyimide film as a substrate and had 10 µm high irregularities under conditions of 0.1 MPa, 1 s, and 160° C. (solder ball formed on one side), and the filling properties and the heat resistance were examined. Evaluation of the filling properties was carried out by polishing a cross section of the semiconductor chip, examining the area around irregularities of the wiring substrate using an optical microscope, and checking for the presence or absence of voids having a diameter of 5 μm or greater. An evaluation of "0" was given when there were no voids having a diameter of 5 μm or greater, and "X" when there were. Reflow crack resistance and temperature cycle resistance tests were employed as methods of evaluating the heat resistance.

Evaluation of the reflow crack resistance was carried out by examining cracks in a sample by eye and an ultrasonic microscope when subjected twice to a treatment involving passing the sample through an IR reflow furnace whose temperature was set so that the maximum temperature of the sample surface was maintained at 260° C. for 20 seconds and cooling by leaving it to stand at room temperature. An evaluation of "0" was given when all 10 samples had no cracks and "X" when at least one sample had a crack.

Evaluation of the temperature cycle resistance was carried out by 1,000 cycles of a step of leaving a sample in an atmosphere at −55° C. for 30 minutes and subsequently leaving it in an atmosphere at 125° C. for 30 minutes, and was "O" if all 10 samples had no damage such as peeling off or cracks when examined using an ultrasonic microscope, and "X" if at least one occurred.

(7) Wire Filling Properties

The filling properties were evaluated for a sample formed by bonding together, under conditions of 0.1 MPa, 1 s, and 160° C., a semiconductor chip, an adhesive sheet, and a semiconductor chip having a gold wire (diameter 25 μm) laid on the semiconductor chip at a height of 60 μm. A cross section of the semiconductor chip was polished, and the presence or absence of voids having a diameter of 5 μm or greater in the vicinity of the wire was checked using an optical microscope. An evaluation of "O" was given when there were no voids having a diameter of 5 μm or greater and "X" when there were.

(8) Modulus of Elasticity Prior to Curing

The modulus of elasticity at 25° C. and 80° C. of the adhesive sheet in a B-stage state was measured using a dynamic viscoelastometer (DVE-V4, manufactured by Rheology Co., Ltd.) (sample size: length 20 mm, width 4 mm, temperature range −30°C. to 200° C., rate of temperature increase 5° C./min, tensile mode, 10 Hz, automatic static load).

(9) Melt Viscosity

The melt viscosity of the adhesive sheet was measured and calculated by the parallel plate plastometer method below. That is, adhesive sheets were laminated to give a 100 to 300 μm thick film. A sample was prepared by stamping this into a circle having a diameter of 11.3 mm and it was pressurized at 100° C. with a load of 3.0 kgf for 5 seconds, and the melt viscosity was determined using Equation 1 from the thickness of the sample before and that after the pressurization. For the film of Example 2, the melt viscosity of each layer was measured; the first adhesive layer had a melt viscosity of 320,000 Pa·s, and the second adhesive layer had a melt viscosity of 2,640 Pa·s.

[Equation 1]

$$t = \eta \frac{3V^2}{8\pi F}\left(\frac{1}{z^4} - \frac{1}{z_0^4}\right)$$ Formula 1

(In the formula, Z0 is the thickness of the adhesive sheet before applying a load, Z is the thickness of the adhesive sheet after applying the load, V is the volume of the adhesive sheet, F is the load applied, and t is the time for which the load is applied.)

A method of preparing a sample is explained in detail. When the thickness of a single adhesive sheet was less than 100 μm, a plurality of the adhesive sheets were bonded together to give a thickness of 100 to 300 μm. This is because when the thickness is 100 to 300 μm, the reproducibility of measurement is good. For example, when the thickness of a single adhesive sheet is 40 μm, 3 to 7 adhesive sheets may be bonded together. The conditions for bonding together depend on the sample; they are bonded together so that no peel off occurs during measurement at the interface where they are bonded together, and the conditions are normally such that the adhesive sheet does not cure.

Evaluation results are given in Table 1.

TABLE 1

| Item | Units | Examples | | | | | | | |
|---|---|---|---|---|---|---|---|---|---|
| | | 1 | 2 | 3 | 4 | 5 | 6 | 7 | 8 |
| HTR-860P-3 | Parts by weight | 28 | 28 | 28 | 44 | 33 | 32 | 28 | 44 |
| S0-C2 | Parts by weight | 95 | 95 | 95 | 47 | 66 | 177 | 41 | 110 |
| High molecular weight component | wt % | 29 | 29 | 29 | 40 | 33 | 32 | 29 | 40 |
| Filler (relative to 100 parts by weight of resin) | Parts by weight | 100 | 100 | 100 | 42 | 66 | 179 | 43 | 99 |
| Film thickness | μm | 75 | 75 | 50 | 75 | 75 | 75 | 75 | 75 |
| Stage C modulus of elasticity (170° C.) | MPa | 160 | 120 | 160 | 50 | 90 | 200 | 100 | 140 |
| Adhesive strength | kg | 2 | 2.3 | 2 | 1.8 | 2 | 1.6 | 1.8 | 2.2 |
| Lamination properties | — | ○ | ○ | ○ | ○ | ○ | ○ | ○ | ○ |
| Flow | μm | 757 | 758 | 759 | 760 | 1200 | 770 | 1800 | 680 |
| Dicing properties | — | ○ | ○ | ○ | ○ | ○ | ○ | ○ | ○ |
| Filling properties | — | ○ | ○ | ○ | ○ | ○ | ○ | ○ | ○ |
| Reflow crack resistance | — | ○ | ○ | ○ | ○ | ○ | ○ | ○ | ○ |
| Temperature cycle resistance | — | ○ | ○ | ○ | ○ | ○ | ○ | ○ | ○ |
| Wire filling properties | — | ○ | ○ | ○ | ○ | ○ | ○ | ○ | ○ |
| Melt viscosity (100° C.) | Pa·S | 2640 | 2640 | 2630 | 2630 | 1660 | 2600 | 1110 | 2940 |
| Stage B modulus of elasticity (25° C.) | MPa | 600 | 580 | 614 | 340 | 380 | 900 | 320 | 560 |
| Stage B modulus of elasticity (80° C.) | MPa | 1 | 1 | 1.4 | 0.8 | 0.3 | 1.9 | 0.8 | 1.1 |

| Item | Units | Comparative Examples | | |
|---|---|---|---|---|
| | | 1 | 2 | 3 |
| HTR-860P-3 | Parts by weight | 28 | 66 | 66 |
| S0-C2 | Parts by weight | 0 | 253 | 57 |
| High molecular weight component | wt % | 29 | 50 | 50 |

TABLE 1-continued

| | | | | |
|---|---|---|---|---|
| Filler (relative to 100 parts by weight of resin) | Parts by weight | 0 | 190 | 43 |
| Film thickness | μm | 75 | 75 | 75 |
| Stage C modulus of elasticity (170° C.) | MPa | 40 | 800 | 30 |
| Adhesive strength | kg | 1.6 | 0.1 | 2.6 |
| Lamination properties | — | ○ | X | ○ |
| Flow | μm | 2000 | 130 | 340 |
| Dicing properties | — | X | X | X |
| Filling properties | — | ○ | X | X |
| Reflow crack resistance | — | ○ | X | ○ |
| Temperature cycle resistance | — | ○ | X | ○ |
| Wire filling properties | — | ○ | X | X |
| Melt viscosity (100° C.) | Pa·S | 980 | 15380 | 7700 |
| Stage B modulus of elasticity (25° C.) | MPa | 200 | 1200 | 600 |
| Stage B modulus of elasticity (80° C.) | MPa | 0.05 | 15 | 3 |

Examples 1 to 8 exhibited good dicing properties and good filling properties for irregularities of the substrate and wire. Comparative Examples 1 to 3 all exhibited poor dicing properties.

As hereinbefore described, the present invention is explained by way of examples, and it has been found that the following effects can be exhibited. When the adhesive sheet of the present invention is used, in a dicing step of production of a semiconductor device, a wafer and the adhesive sheet can be cut well. The semiconductor chips do not fly off during dicing, and the ease of pickup is also good. Furthermore, in a step of bonding a semiconductor chip, a substrate having irregularities, and a wire-equipped semiconductor chip, filling properties are excellent, and when mounting a semiconductor chip on a supporting member for mounting a semiconductor, the required heat resistance and moisture resistance are obtained, and the workability is excellent. From these results, in accordance with the adhesive sheet of the present invention, it is possible to improve the reliability of a semiconductor device and enhance the processing speed and the yield of a semiconductor device.

The invention claimed is:

1. A process for producing a semiconductor device, comprising steps of:
   laminating an integrated dicing tape-adhesive sheet and a wafer, and then cutting the wafer and the dicing tape-adhesive sheet, to give an adhesive-equipped semiconductor chip consisting of a semiconductor chip and an adhesive sheet, wherein the adhesive sheet has a thickness of 10 to 250 μm and consists essentially of (a) 100 parts by weight of a resin comprising 15 to 40 wt% of an acrylic rubber and 60 to 85 wt% a thermosetting component containing an epoxy resin as a main component, and (b) 40 to 180 parts by weight of a filler that has a Mohs' hardness of 3 to 8, the adhesive sheet being directly in contact with the semiconductor chip, and
   bonding the adhesive-equipped semiconductor chip to a wire-equipped semiconductor chip with a load applied so as to fill in with adhesive of the adhesive sheet irregularities due to a wire of the wire-equipped semiconductor chip.

2. The process for producing a semiconductor device according to claim 1, wherein the load applied to bond the adhesive-equipped semiconductor chip to the wire-equipped semiconductor chip is 0.001 to 1 MPa.

3. The process for producing a semiconductor device according to claim 1, wherein the integrated dicing tape-adhesive sheet is formed by layering an adhesive sheet and a dicing tape.

4. The process for producing a semiconductor device according to claim 1, wherein the acrylic rubber has a weight-average molecular weight of at least 100,000 and a Tg of −50° C. to 50° C.

5. The process for producing a semiconductor device according to claim 1, wherein said integrated dicing tape-adhesive sheet is an integrated dicing/die bonding tape adhesive sheet.

6. The process for producing a semiconductor device according to claim 1, wherein said laminating is performed at a temperature of 0° C. to 80° C.

7. The process for producing a semiconductor device according to claim 1, wherein during said bonding the irregularities are heated to a temperature of 60° C. to 240° C.

8. The process for producing a semiconductor device according to claim 1, wherein the wafer and adhesive sheet are cut by a rotating blade.

9. The process for producing a semiconductor device according to claim 1, wherein the filler has an average particle size of 0.05 to 5 μm and a specific surface area of 2 to 200 m$^2$/g.

10. The process for producing a semiconductor device according to claim 9, wherein said average particle size is 0.3 to 1 μm and said specific surface area is 2 to 10 m$^2$/g.

11. The process for producing a semiconductor device according to claim 1, wherein the filler is included in the adhesive sheet in an amount of 60 of 120 parts by weight relative to 100 parts by weight of resin of the adhesive sheet.

12. The process for producing a semiconductor device according to claim 1, wherein the filler is made of a material selected from the group consisting of alumina and silica.

13. The process for producing a semiconductor device according to claim 1, wherein said Mohs' hardness is 6 to 7.

14. The process for producing a semiconductor device according to claim 1, wherein said adhesive sheet provides insulation between said adhesive-equipped semiconductor chip and said wire-equipped semiconductor chip.

15. The process for producing a semiconductor device according to claim 1, wherein said adhesive sheet is directly in contact with said wire-equipped semiconductor chip.

* * * * *